United States Patent [19]

Toriyama

[11] Patent Number: 5,336,919
[45] Date of Patent: Aug. 9, 1994

[54] SOLID-STATE IMAGE PICKUP DEVICE WITH HIGH MELTING POINT METAL SHIELD

[75] Inventor: Keiji Toriyama, Tokyo, Japan

[73] Assignee: NEC Corporation, Tokyo, Japan

[21] Appl. No.: 798,137

[22] Filed: Nov. 26, 1991

[30] Foreign Application Priority Data

Nov. 26, 1990 [JP] Japan .................. 2-321912

[51] Int. Cl.$^5$ ................ H01L 27/14; H01L 31/00
[52] U.S. Cl. ................... 257/435; 257/437; 257/659
[58] Field of Search .......... 357/30 L, 31, 84, 24 LR, 357/32, 71; 358/213.24

[56] References Cited

U.S. PATENT DOCUMENTS 4,354,104 10/1982 Chikamura et al. ............. 357/31
4,556,897 12/1985 Yorikane et al. ............... 357/71

FOREIGN PATENT DOCUMENTS 61-14749 1/1987 Japan .................. 357/30 L
3-9564 1/1991 Japan .................. 357/30 L Primary Examiner—Robert Limanek
Attorney, Agent, or Firm—Sughrue, Mion, Zinn, Macpeak & Seas

[57] ABSTRACT

In a solid-state image pickup device, a high melting point metal film is used in a cell portion region (photoelectric conversion portion) as a light shielding film which defines an open area of a photoelectric conversion element and an aluminum film which is covered with a high melting point metal is used in a peripheral region as wiring.

5 Claims, 6 Drawing Sheets

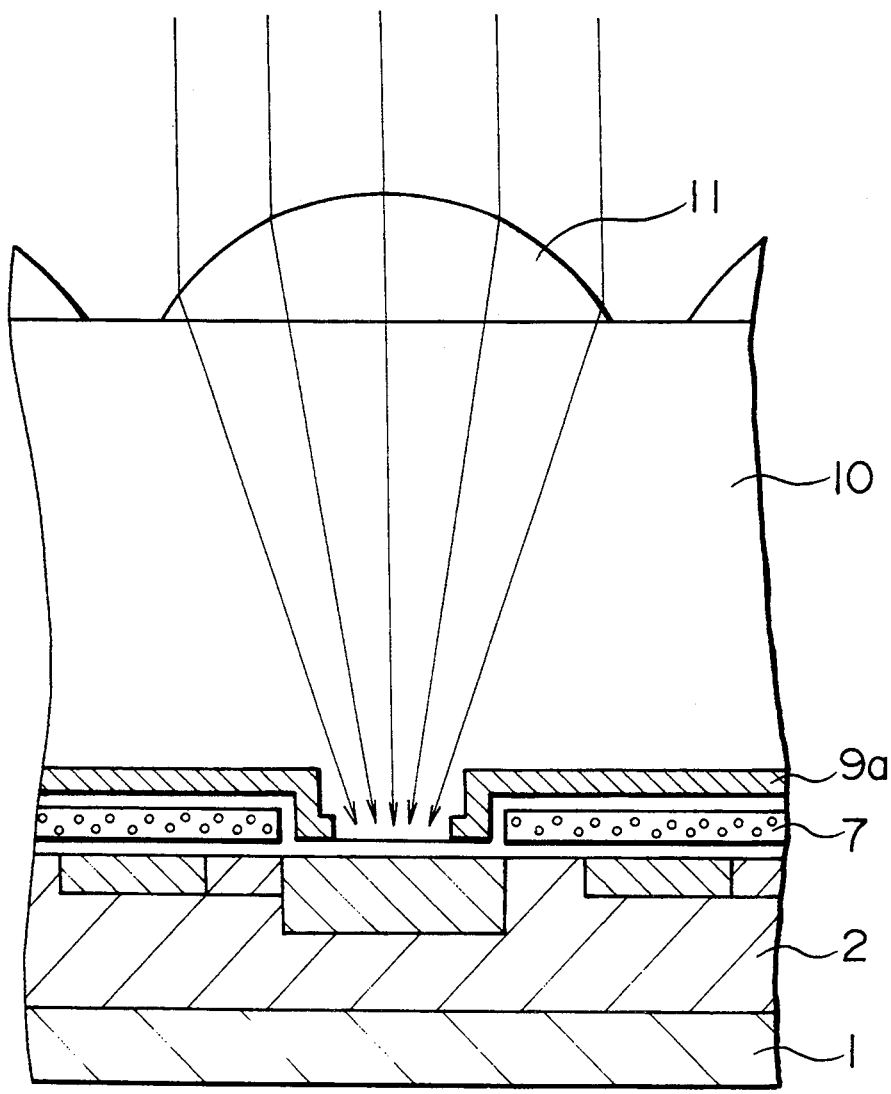

SOLID-STATE IMAGE PICKUP DEVICE WITH HIGH MELTING POINT METAL SHIELD

BACKGROUND OF THE INVENTION

1. Field of the Invention

The present invention relates to a solid-state image pickup device and in particular to a structure of a metal film which forms wirings and light shielding films of the solid-state image pickup device, i.e. solid state image sensor.

2. Description of the Related Art

Referring now to FIGS. 1(a) and 1(b), there are shown sectional views of a cell portion region (photoelectric conversion portion) and a peripheral region. In the drawing, a reference numeral 1 denotes an n-type semiconductor substrate; 2 a p-type well formed thereon; 3 an n-conductivity type photoelectric conversion region formed in the p-type well 2; 4 an n-conductivity type charge transfer region also formed in the p-type well 2; 5 an element isolation region which is formed between elements by doping a p-type dopant at a high concentration; 6 an insulating film formed on the p-type well 2; 7 an electric charge transfer electrode formed of polysilicon serving also as an electric charge read out electrode; 8 an aluminum wiring formed on the peripheral region; and 8b an aluminum light shielding film having an opening or hole above the photoelectric conversion region 3.

A color filter film 10 and a microlens 11, etc. are formed above the solid-state image pickup device as shown in FIG. 2.

An aluminum thin film is used as the light shielding film in the above mentioned prior art solid-state image pickup device. The aluminum thin film should have a thickness of about 0.8 μm in order to obtain sufficient light shielding ability. The width of the opening of the photoelectric conversion element has been reduced as high density integration of the solid-state image pickup devices has recently been remarkably advanced. A device having 380 thousand pixels and compatible with a ⅓ inch tube has an opening width not higher than 2 μm. It is essential to condense incident light by forming a microlens 11 on the photoelectric conversion element as shown in FIG. 2 in order to prevent lowering of the sensitivity of the device if the opening area is reduced. However, if a conventional aluminum film is used as the light shielding film, the area of the opening formed in the upper side 8ba of the light shielding film 8b would become equal to that in the underside 8bb of the film 8b since the thickness of the aluminum thin film is larger than the dimension of the opening of the light shielding film. That is, the opening would be formed having a narrow width along the total height (usually not less than 1 μm) of the aluminum film including the thickness of the electric charge transfer electrode 7. Accordingly, the incident light from the periphery of the microlens 11 will be reflected in the vicinity of the edge of the opening of the aluminum light shielding film 8b, resulting in lowering the sensitivity of the device.

Regions 14 other than the region 13 to be exposed are exposed due to random reflections of the light on the surface of the aluminum light shielding film 8b as shown in FIG. 3 when a negative photo-resist which will become a dye matrix 12 of the color filter in the solid-state image pickup device using a conventional aluminum light shielding film. As a result of this, patterning accuracy is lowered.

There is the possibility that projections which are referred to as "hillock" may be formed on the aluminum wiring or aluminum light shielding film. This may cause the reliability of the products to be lowered.

SUMMARY OF THE INVENTION

It is an object of the present invention to obviate the above-mentioned defects of the prior art solid-state image pickup device.

According to the present invention, in a solid-state image pickup device, a high melting point metal film is used in a cell portion region (photoelectric conversion portion) as a light shielding film which defines the opening area of a photoelectric conversion element and an aluminum film which is covered with a high melting point metal is used in a peripheral region as a wiring.

BRIEF DESCRIPTION OF THE DRAWINGS

FIG. 5 is a sectional view explaining the effect of the embodiment of FIGS. 1(a) and 1(b)

DESCRIPTION THE PREFERRED EMBODIMENT

An embodiment of the present invention will be described with reference to the drawings.

Figures 1A, 1B:
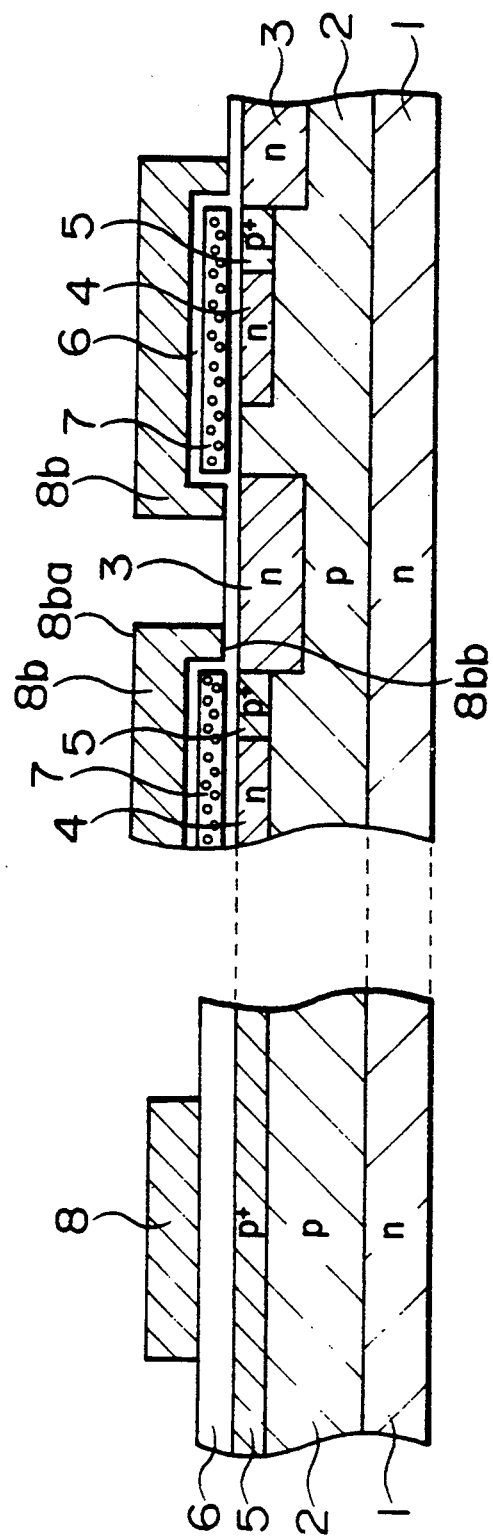
FIGS. 1(a) and 1(b) are sectional views showing a prior art device.
Figure 2:
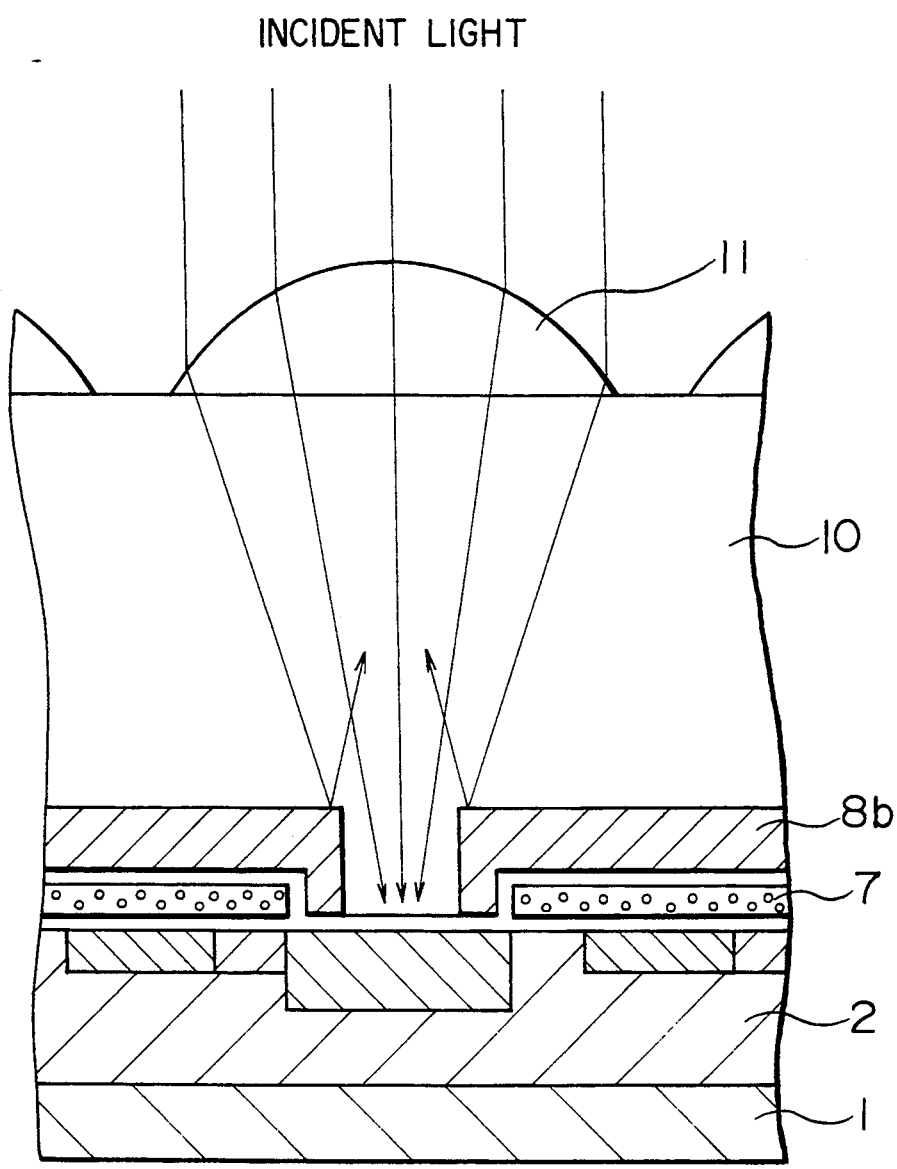
FIGS. 2 and 3 are sectional views explaining the problems of the prior art device.
Figure 3:
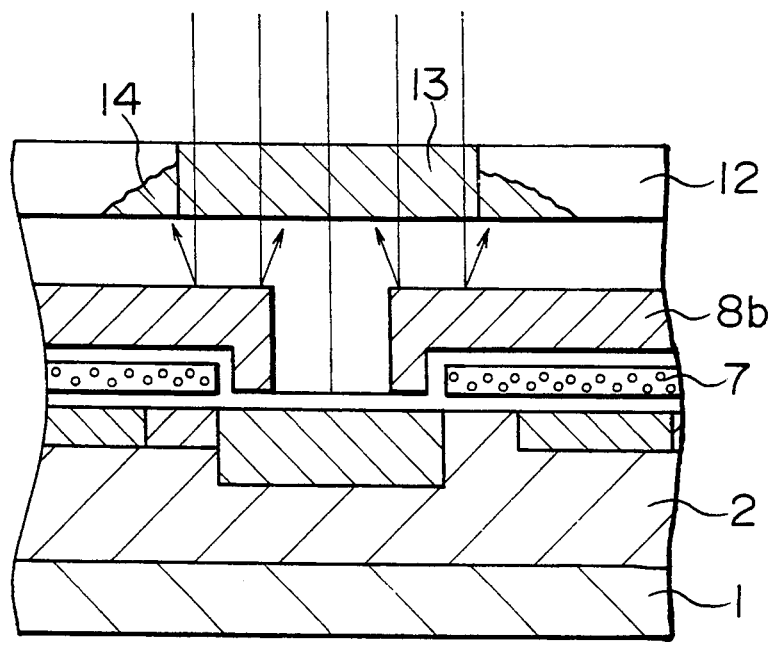
Figures 4A, 4B:
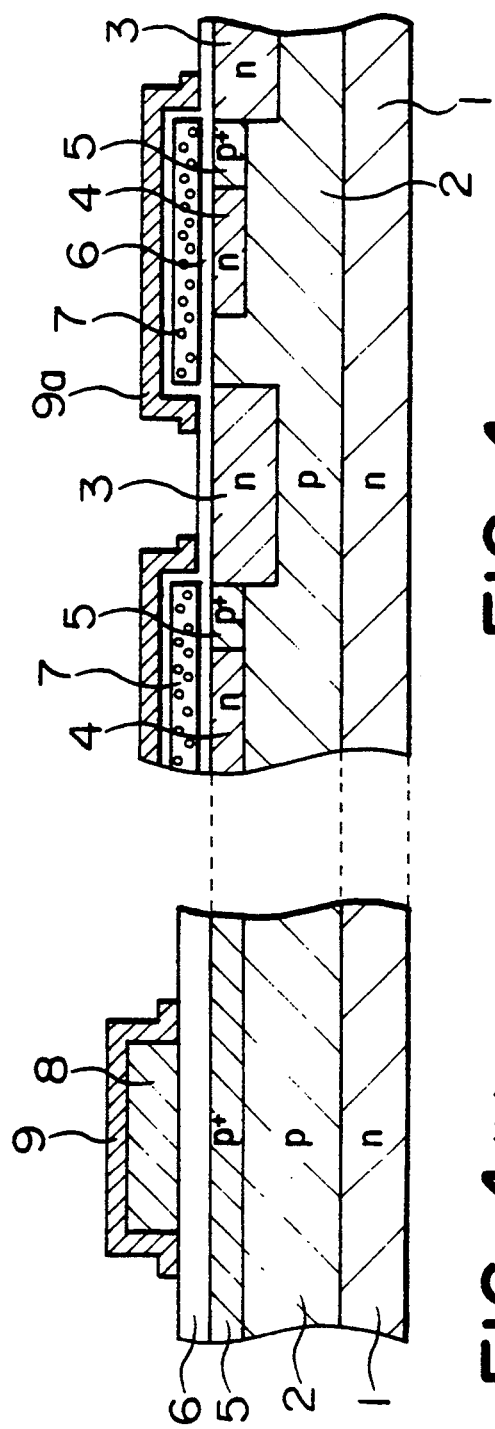
FIGS. 4(a) and 4(b) are sectional views showing a first embodiment of the present invention.

Referring now to FIGS. 4(a) and 4(b), there are shown a cell portion region and a peripheral region of the cell portion of a first embodiment of a solid-state image pickup device of the present invention. As shown in FIGS. 4(a) and 4(b), a p-type well 2 is formed on an n-type semiconductor substrate 1. An n-conductivity type photoelectric conversion region 3, an n-conductivity type electric charge transfer area 4, and an element isolation region 5 which is a p-conductivity type highly doped concentration region are formed in the surface region of the p-type well 2. An electric charge transfer electrode 7 made of polysilicon is formed via and within an insulating film 6 in the cell portion region above the semiconductor substrate. An aluminum wiring 8 is formed on the insulating layer 6 in the peripheral region of the cell region above the semiconductor substrate. A tungsten thin film 9 which covers the aluminum wiring 8 and a tungsten light shielding film 9a which defines the opening of a photoelectric conversion element are formed in the peripheral and cell regions, respectively.

If the tungsten thin film 9 is used as a light shielding film, the thin film 9 having a thickness of about 0.4 μm is capable of providing sufficient light shielding ability. Accordingly, in this structure, the height of the upper surface of the light shielding film can be made lower than that of the prior art and the opening area on the upper surface can be made wider than that of the prior art. Hence, the light from the periphery of a microlens 11 is prevented from being reflected on the light shielding film as shown in FIG. 5 when a color filter layer 10 and a microlens 11 are formed on the solid-state image pickup device of the present embodiment.

An unwanted region is not exposed to light on patterning of a color filter dye matrix if a tungsten thin film is used as a light shielding film since a high melting point metal like tungsten has a light reflection factor which is about a quarter of that of aluminum. This enables a precise patterning to be carried out.

Since the wiring in the peripheral region is fabricated by covering the aluminum film with the high melting point metal, the aluminum film can be prevented from being etched in an etching step for patterning the high melting point metal. The tungsten thin film remains on the aluminum wiring and functions as a protective film after the patterning step to prevent a hillock from forming on the aluminum wiring.

Figures 6A, 6B:
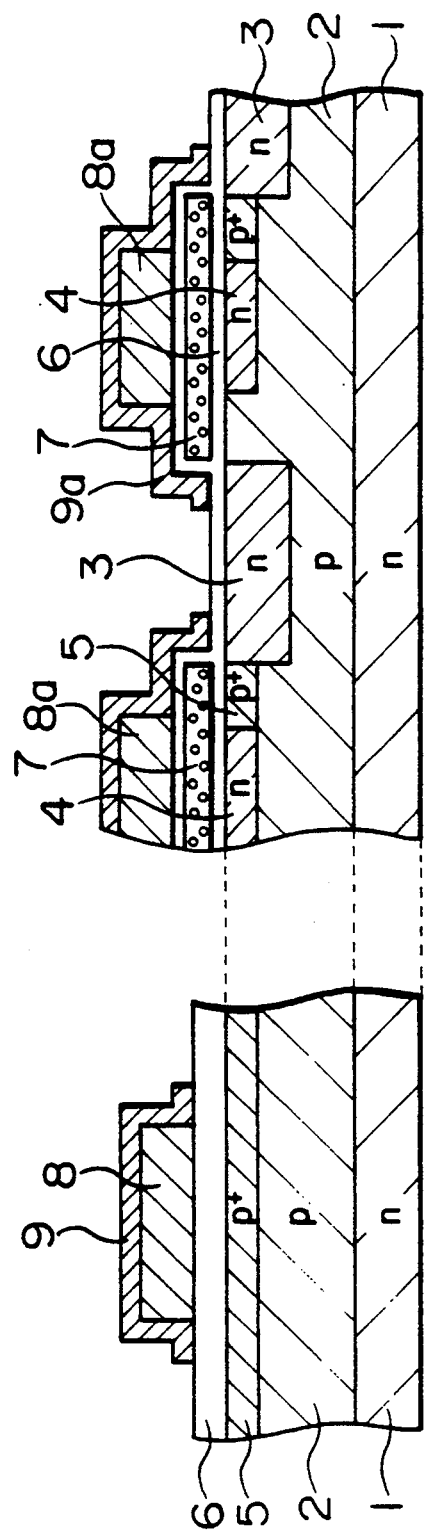
FIGS. 6(a) and 6(b) are sectional views showing a second embodiment of the present invention.

Referring now to FIGS. 6(a) and 6(b), there are shown the cell portion and the peripheral regions of a second embodiment of a solid-state image pickup device of the present invention. In this embodiment, when the aluminum wiring 8 is formed in the peripheral region of the cell portion by patterning the aluminum thin film, a portion corresponding to the electric charge transfer region 4 is formed with an aluminum light shielding film 8a in the cell portion region simultaneously with this. The second embodiment is substantially identical with the first embodiment except for the foregoing. In the present embodiment, the tungsten thin film can be made thinner by providing the aluminum light shielding film 8a.

As mentioned above, in the solid-state image pickup device of the present invention, the high melting point metal film is used in the cell portion region as the light shielding film which defines the opening of the photoelectric conversion element and the aluminum wiring is covered with the high melting point metal in the peripheral region. Therefore, incident light from the periphery of the microlens will not be reflected on the light shielding film so that a decrease in sensitivity can be prevented.

Since the high melting point metal such as tungsten has a light reflection factor of about 20% while aluminum has a factor not less than 90%, pattern distortion due to reflection of light on patterning of a color filter can be prevented from occurring in accordance with the present invention.

Since the aluminum wiring is protected by the high melting point metal film, it is hard for hillocks to grow so that the reliability of the device can be enhanced.

What is claimed is:

1. A solid-state image pickup device, comprising:
   a plurality of photoelectric conversion elements formed in a photoelectric conversion portion for converting incident light into electrical signals;
   aluminum wirings formed on a semiconductor substrate outside the photoelectric conversion portion; and
   a film made of a high melting point metal serving as a light shielding film which forms openings of the photoelectric conversion elements in the photoelectric conversion portion as well as a protective film for the aluminum wirings which covers the aluminum wirings, said film having a thickness less than that of the aluminum wirings, said film also having a first surface which faces the aluminum wirings and a second surface which is opposite said first surface, said second surface lacking an aluminum layer thereon.

2. A solid-state image pickup device as defined in claim 1 in which said high melting point metal forming the light shielding film is tungsten.

3. A solid-state image pickup device as defined in claim 1 or 2 in which said light shielding film has a thickness of about 0.4 μm.

4. A solid-state image pickup device, comprising:
   a plurality of photoelectric conversion elements formed in a photoelectric conversion portion for converting incident light into electrical signals;
   aluminum wirings formed on a semiconductor substrate outside the photoelectric conversion portion;
   a film made of a high melting point metal serving as a light shielding film which defines openings of the photoelectric conversion elements in the photoelectric conversion portion and which covers the aluminum wirings, said film having a thickness less than that of the aluminum wirings; and
   an aluminum light-shielding film formed below the high melting point metal film over a charge transfer region in the photoelectric conversion portion.

5. A solid-state image pickup device, comprising:
   a plurality of photoelectric conversion elements formed in a photoelectric conversion portion for converting incident light into electrical signals;
   aluminum wirings formed on a semiconductor substrate outside the photoelectric conversion portion;
   a film made of tungsten serving as a light shielding film which defines openings of the photoelectric conversion elements in the photoelectric conversion portion and which covers the aluminum wirings, said film having a thickness less than that of the aluminum wirings; and
   an aluminum light-shielding film formed below the high melting point metal film over a charge transfer region in the photoelectric conversion portion.

* * * * *